(12) United States Patent
Baruzzi et al.

(10) Patent No.: US 9,201,119 B2
(45) Date of Patent: Dec. 1, 2015

(54) BATTERY FUEL GAUGE

(71) Applicant: QUALCOMM Incorporated, San Diego, CA (US)

(72) Inventors: Paolo Baruzzi, Santa Clara, CA (US); Georgios Paparrizos, Foster City, CA (US); Giovanni Garcea, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 473 days.

(21) Appl. No.: 13/719,062

(22) Filed: Dec. 18, 2012

(65) Prior Publication Data

US 2013/0158916 A1 Jun. 20, 2013

Related U.S. Application Data

(60) Provisional application No. 61/577,611, filed on Dec. 19, 2011.

(51) Int. Cl.
*G01R 31/36* (2006.01)
*G06F 15/00* (2006.01)

(52) U.S. Cl.
CPC ........ *G01R 31/3624* (2013.01); *G01R 31/3651* (2013.01); *G06F 15/00* (2013.01)

(58) Field of Classification Search
CPC ........... G01R 31/3651; G01R 31/3624; G01R 31/362; G01R 31/3662; G01R 31/3648; G01R 31/3675; G01R 31/3679; G06F 15/00; H02J 7/0072; Y02B 40/90
USPC ........ 702/63, 54, 65; 320/106, 132, 134, 136; 324/427, 430, 435
See application file for complete search history.

(56) References Cited

U.S. PATENT DOCUMENTS

| | | | |
|---|---|---|---|
| 4,876,513 | A | 10/1989 | Brilmyer et al. |
| 5,650,712 | A | 7/1997 | Kawai et al. |
| 5,698,983 | A | 12/1997 | Arai et al. |
| 5,717,312 | A | 2/1998 | Maeda et al. |
| 6,046,574 | A | 4/2000 | Baranowski et al. |
| 6,229,285 | B1 | 5/2001 | Ding |
| 6,789,026 | B2 | 9/2004 | Barsoukov et al. |
| 6,832,171 | B2 | 12/2004 | Barsoukov et al. |
| 6,892,148 | B2 | 5/2005 | Barsoukov et al. |

(Continued)

FOREIGN PATENT DOCUMENTS

| | | |
|---|---|---|
| DE | 10301823 A1 | 7/2004 |
| DE | 102009042194 A1 | 4/2011 |

(Continued)

OTHER PUBLICATIONS

International Search Report and Written Opinion—PCT/US2013/021037—ISA/EPO—Jun. 19, 2013.

(Continued)

*Primary Examiner* — John H Le
(74) *Attorney, Agent, or Firm* — Fountainhead Law Group P.C.

(57) ABSTRACT

A system for estimating battery state of charge (SoC) includes evaluating a battery model to produce an estimated battery voltage using a previously produced SoC. Current and voltage measurements are combined with the estimated battery voltage to produce a present battery SoC. The battery model may be updated by taking battery measurements when certain conditions occur.

20 Claims, 12 Drawing Sheets

(56) References Cited

U.S. PATENT DOCUMENTS

| | | |
|---|---|---|
| 6,932,174 B2 | 8/2005 | Hirata et al. |
| 7,023,216 B2 | 4/2006 | Prema et al. |
| 7,362,074 B2 | 4/2008 | Iwane et al. |
| 8,384,823 B2 | 2/2013 | Geris et al. |
| 2008/0169819 A1 | 7/2008 | Ishii |
| 2009/0276172 A1* | 11/2009 | Nishi ............................ 702/63 |
| 2010/0280777 A1 | 11/2010 | Jin et al. |
| 2011/0089907 A1 | 4/2011 | Bhardwaj et al. |
| 2011/0112782 A1 | 5/2011 | Majima et al. |
| 2011/0128153 A1 | 6/2011 | Sims et al. |
| 2011/0224928 A1 | 9/2011 | Lin et al. |
| 2012/0098481 A1* | 4/2012 | Hunter et al. ................ 320/106 |
| 2012/0105009 A1 | 5/2012 | Yao |
| 2012/0133331 A1 | 5/2012 | Ling et al. |
| 2012/0256569 A1 | 10/2012 | Kawahara et al. |
| 2013/0274974 A1 | 10/2013 | Kusumi et al. |

FOREIGN PATENT DOCUMENTS

| | | |
|---|---|---|
| EP | 2063280 A1 | 5/2009 |
| JP | 2007188767 A | 7/2007 |
| WO | 2012156602 A1 | 11/2012 |

OTHER PUBLICATIONS

Yu, Ming, et al., "Theory and Implementation of Impedance Track Battery Fuel-Gauging Algorithm in bq2750x Family"; Application Report; Jan. 2008; 11 pages; SLUA450; Texas Instruments, Dallas, Texas.

Codeca, et al., "On battery State of Charge estimation: a new mixed algorithm," 17th IEEE International Conference on Control Applications Part of 2008 IEEE Multi-conference on Systems and Control San Antonio, Texas, USA, Sep. 3-5, 2008, pp. 102-107.

Codeca, et al., "The Mix Estimation Algorithm for Battery State-of-Charge Estimator—Analysis of the Sensitivity to Measurement Errors," Joint 48th IEEE Conference on Decision and Control and 28th Chinese Control Conference, Shanghai, P.R. China, Dec. 16-18, 2009, pp. 8083-8088.

International Preliminary Report on Patentability—PCT/US2013/021037, The International Bureau of WIPO—Geneva, Switzerland, Jun. 24, 2014.

* cited by examiner

BATTERY FUEL GAUGE

CROSS REFERENCE TO RELATED APPLICATIONS

The present disclosure claims priority to U.S. Provisional App. No. 61/577,611 filed Dec. 19, 2011, the content of which is incorporated herein by reference in its entirety for all purposes.

BACKGROUND

Unless otherwise indicated herein, the approaches described in this section are not prior art to the claims in this application and are not admitted to be prior art by inclusion in this section.

The amount of electric charge that a battery can store is typically referred to as the battery's "capacity". The state of charge (SoC) of a battery expresses the battery's present capacity as a percentage of the battery's maximum capacity. The SoC of a battery is dependent on inherent chemical characteristics of the battery and characteristics of the electrical system in which the battery is installed, as well as operating conditions of the battery. Batteries that use a specific battery technology and chemistry will behave differently from batteries that use a different battery technology and chemistry. Furthermore, even batteries that use the same technology and chemistry may vary from manufacturer to manufacturer, and from build-lot to build-lot by the same manufacturer.

The performance of individual batteries will also vary based on operating conditions such as temperature, age of the battery, the load coupled to the battery, and so on. The variety and complexity of factors that can affect the performance of a battery are further complicated by the various non-linear relationships between the factors. As a result, estimating the SoC of a battery can be highly sensitive to the specific conditions in which the battery is used or operated due to the complex interplay of measurable variables. Accordingly, conventional systems, methods, and apparatus for determining battery SoC are more computational and memory intensive than is desirable in contemporary mobile electronic devices.

SUMMARY

In embodiments, a system for generating a battery state of charge (SoC) may include a current sensor and a voltage sensor for acquiring respective current and voltage measurements of a battery connected to the system. A battery model may produce an estimated value of battery voltage, which together with the current and voltage measurements may be used to produce a present value of battery SoC. The battery model may use a previously computed value of the battery SoC to estimate the battery voltage. The battery model may include a resistive component that may be updated under certain conditions by using current and voltage measurements of the battery to compute an updated value of the resistive component.

The following detailed description and accompanying drawings provide a better understanding of the nature and advantages of the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
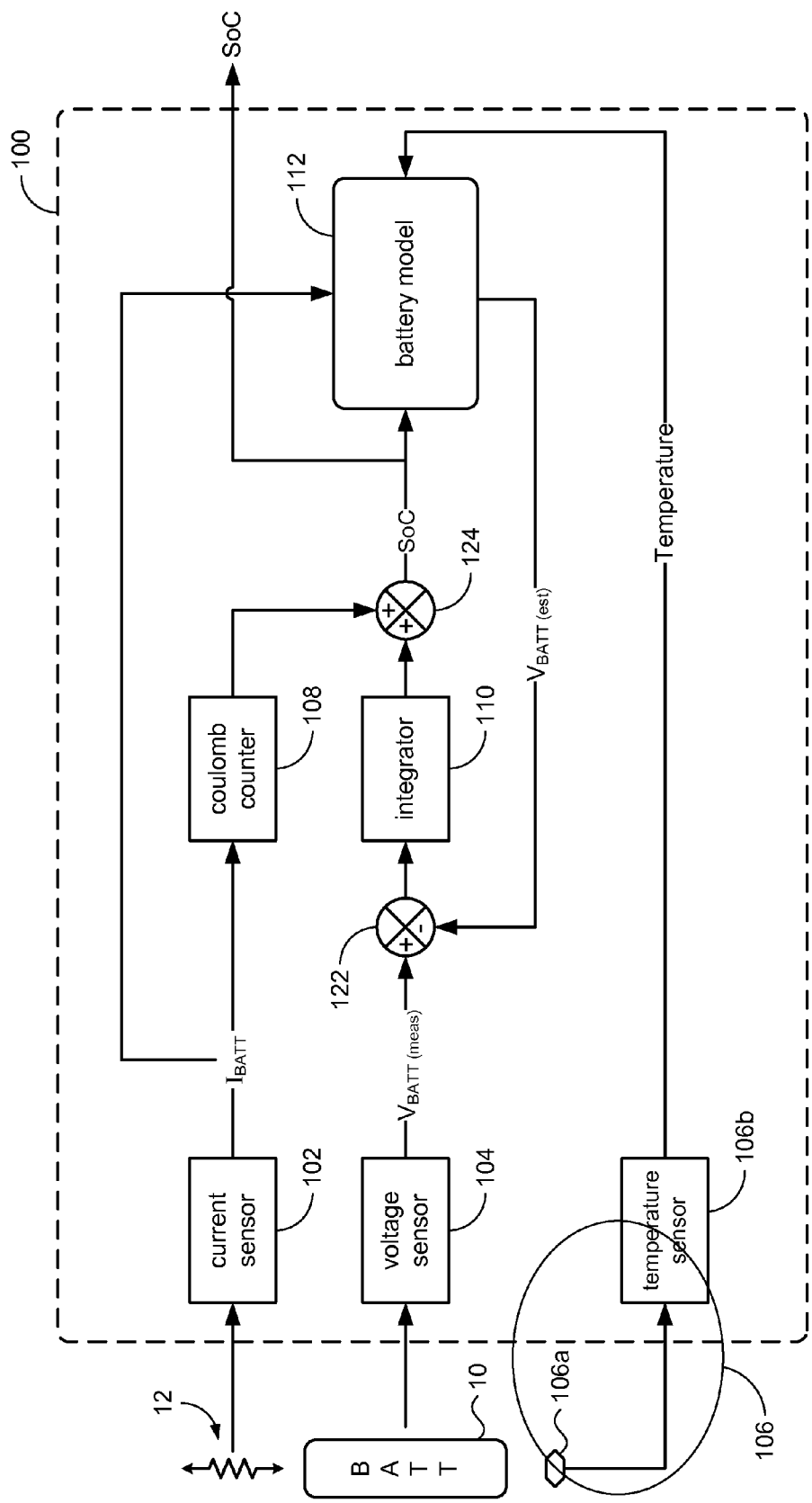
FIG. 1 shows a high level block diagram of system for producing battery SoC in accordance with the present disclosure.

Referring to FIG. 1, a high level block diagram of a fuel gauge system 100 for determining the state of charge (SoC) of a battery 10 in accordance with embodiments of the present disclosure may comprise various sensors to measure or otherwise acquire battery conditions, including for example a current sensor 102, a voltage sensor 104, and a temperature sensor 106a, 106b (collectively referred to as 106). The current sensor 102 may acquire the current flowing in and out of the battery 10. In some embodiments, the current sensor 102 may use a sense resistor 12 to detect the flow of current ($I_{BATT}$) through the battery 10. The voltage sensor 104 may acquire a voltage ($V_{BATT(meas)}$) of the battery 10. In a typical configuration, the battery 10 is connected to power an electronic device (not shown), and so the battery current $I_{BATT}$ and the battery voltage $V_{BATT(meas)}$ may include effects due to loading on the battery by the electronic device. The temperature sensor 106 may comprise a temperature sensing element 106a and circuitry 106b for producing signals indicative of temperature. In some embodiments, the temperature sensing element 106a may be positioned to sense the temperature of the battery 10.

The fuel gauge system 100 may further comprise a coulomb counter 108 coupled to receive a signal indicative of the battery current $I_{BATT}$ from the current sensor 102.

In accordance with the present disclosure, the battery voltage $V_{BATT(meas)}$ may be compared with an estimated battery voltage $V_{BATT(est)}$ generated by a battery model 112 that models the battery 10; e.g., using a summing element 122 that produces an error term that represents a difference between the battery voltage $V_{BATT(meas)}$ and the estimated battery voltage $V_{BATT(est)}$. An error term produced by the summing element 122 may then be integrated by an integrator 110 to produce an integrated error term that feeds into the summing element 124 to produce an estimate of the battery SoC; for example, by summing a previous estimate of battery SoC and the integrated error term.

In accordance with principles of the present disclosure, the battery model 112 may predict the battery voltage of the battery 10, which is output by the battery model as an estimated battery voltage $V_{BATT(est)}$. The prediction of battery voltage made by the battery model 112 may be based on the acquired battery current $I_{BATT}$, the present estimated value of battery SoC, and an acquired temperature.

Figure 2A:
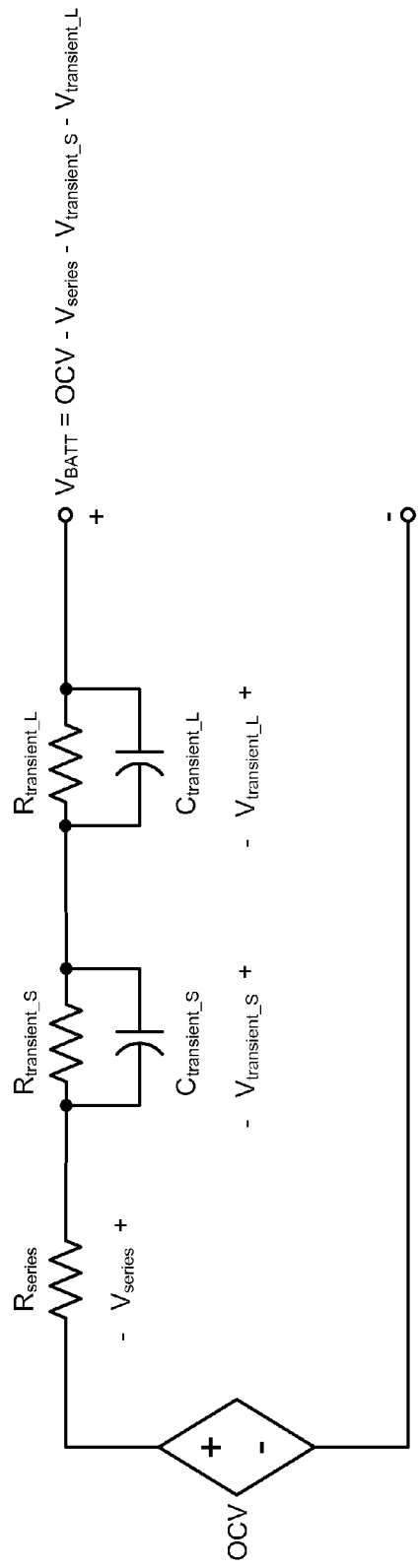
FIGS. 2A and 2B illustrate electrical battery models.

In some embodiments, the battery model 112 may be based on an electrical battery model such as shown in FIG. 2A. The battery model may include a voltage source to represent an open circuit voltage (OCV) of the battery. The battery model may include an equivalent series resistance (ESR) $R_{series}$ and two RC parallel networks to represent the battery's response to transient load current events. A first RC parallel network comprising $R_{transient\_S}$ and $C_{transient\_S}$ may model the short time response to a step load current event. A second RC parallel network comprising $R_{transient\_L}$ and $C_{transient\_L}$ may model the long time response to the step load current event. The battery voltage $V_{BATT}$ may then be computed as the OCV of the battery minus the voltage drops across $R_{series}$ the first RC parallel network, and the second RC parallel network. Elements of the electrical battery model shown in FIG. 2A are dependent on many factors such as operating temperature of the battery, age of the battery, short term and long term transient responses, and so on. The relationships among the battery parameters tend to be nonlinear; e.g., the relationship between the battery OCV and battery SoC is non-linear and temperature dependent.

Figure 2B:
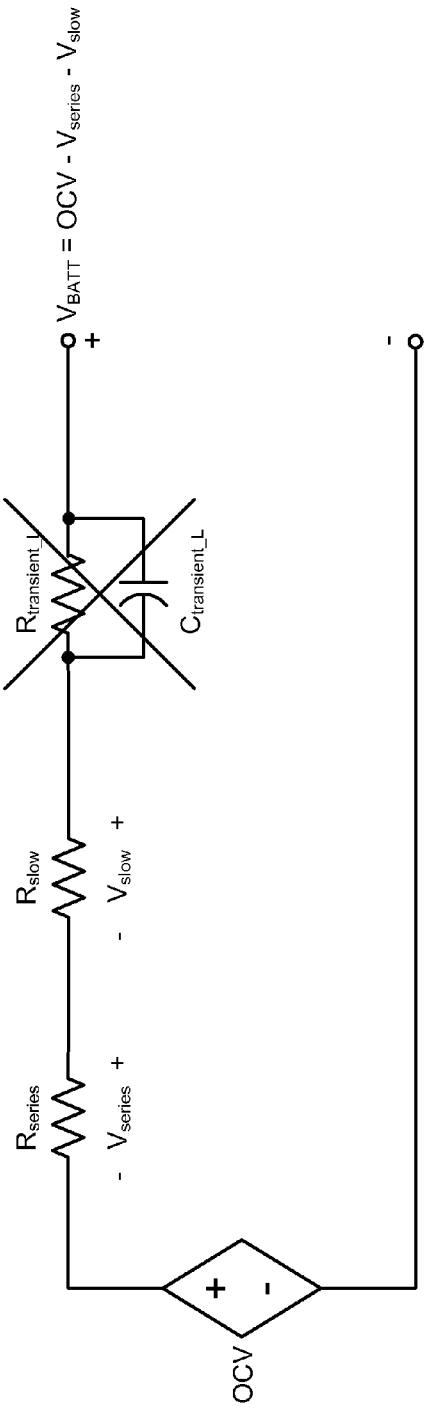

In a particular embodiment, certain simplifying assumptions may be made to produce a battery model 112 that can be used in the fuel gauge system 100. Referring to FIG. 2B, for example, since the response time to transient load current events of the first RC parallel network comprising $R_{transient\_S}$ and $C_{transient\_S}$ can be on the order of minutes, the first RC parallel network may be approximated with a constant resistance $R_{slow}$. Since the response time to transient load current events of the second RC parallel network comprising $R_{transient\_L}$ and $C_{transient\_L}$ can be on the order of hours, the second RC parallel network may be ignored altogether.

Figure 3:
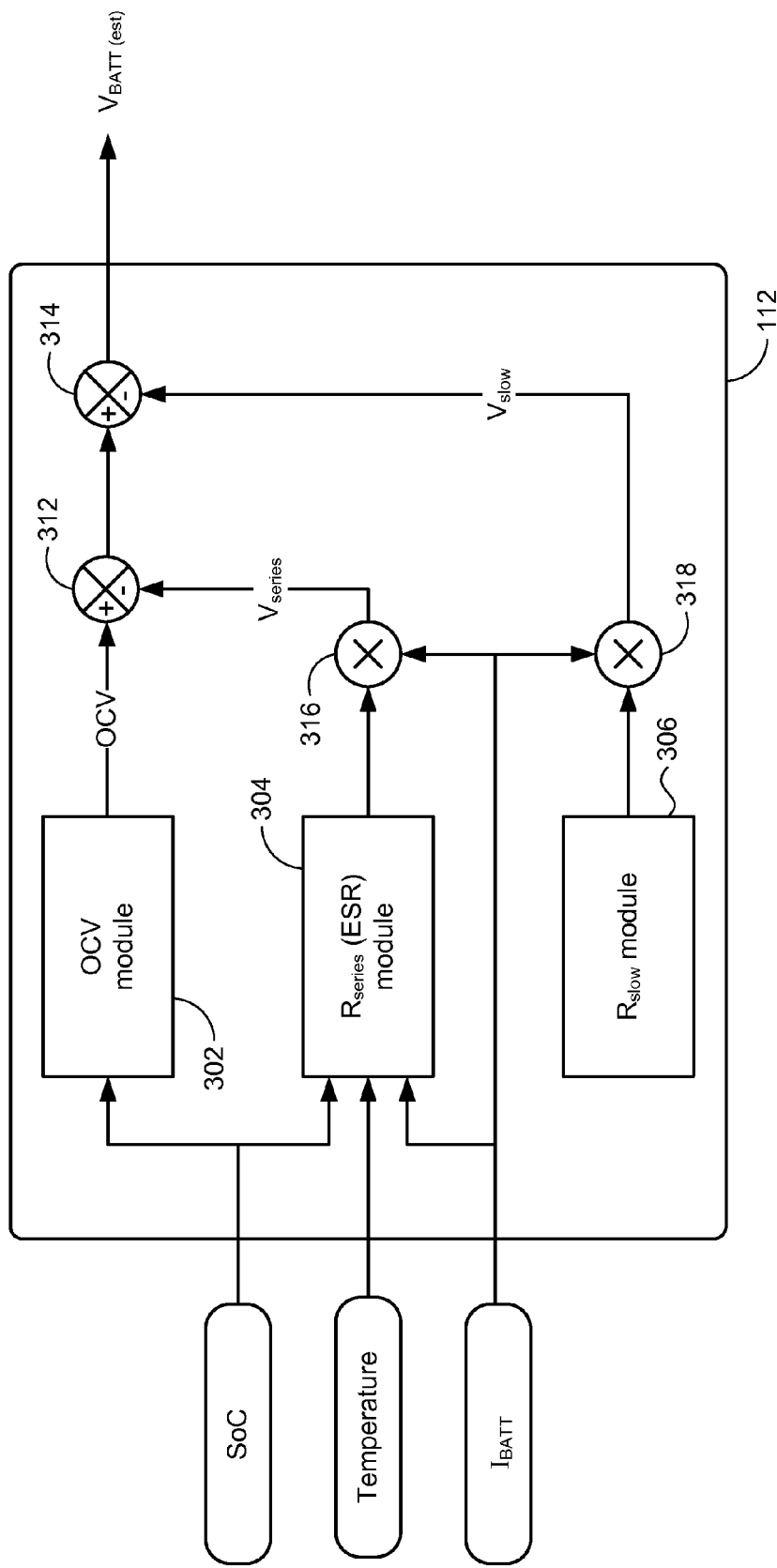
FIG. 3 shows an embodiment of a battery model.

Referring to FIG. 3, the battery model 112, in accordance with a particular embodiment, may include an OCV module 302, an $R_{series}$ module 304, and an $R_{slow}$ module 306. As explained above, inputs to the battery model 112 include the present estimated value of battery SoC, the acquired battery current $I_{BATT}$, and a temperature measurement. As will be explained in more detail below, these inputs may be processed in the battery model 112 to produce the estimated battery voltage $V_{BATT(est)}$.

The OCV module 302 may produce an OCV value that feeds into a summing element 312. The $R_{series}$ module 304 may produce an $R_{series}$ value that feeds into a multiplying element 316 to produce an output $V_{series}$ that represents a multiplication of $I_{BATT}$ and the $R_{series}$ value. The summing element 312 may combine the OCV value and $V_{series}$ to produce an output that represents a difference between the OCV value and $V_{series}$. The $R_{slow}$ module 306 may produce an $R_{slow}$ value that feeds into a multiplying element 318 to produce an output $V_{slow}$ that represents a multiplication of $I_{BATT}$ and the $R_{slow}$ value, which may then feed into a summing element 314. The summing element 314 may combine the output of summing element 312 with $V_{slow}$ to produce the estimated battery voltage $V_{BATT(est)}$ by taking a difference between the output of summing element 312 and $V_{slow}$.

Figure 4:
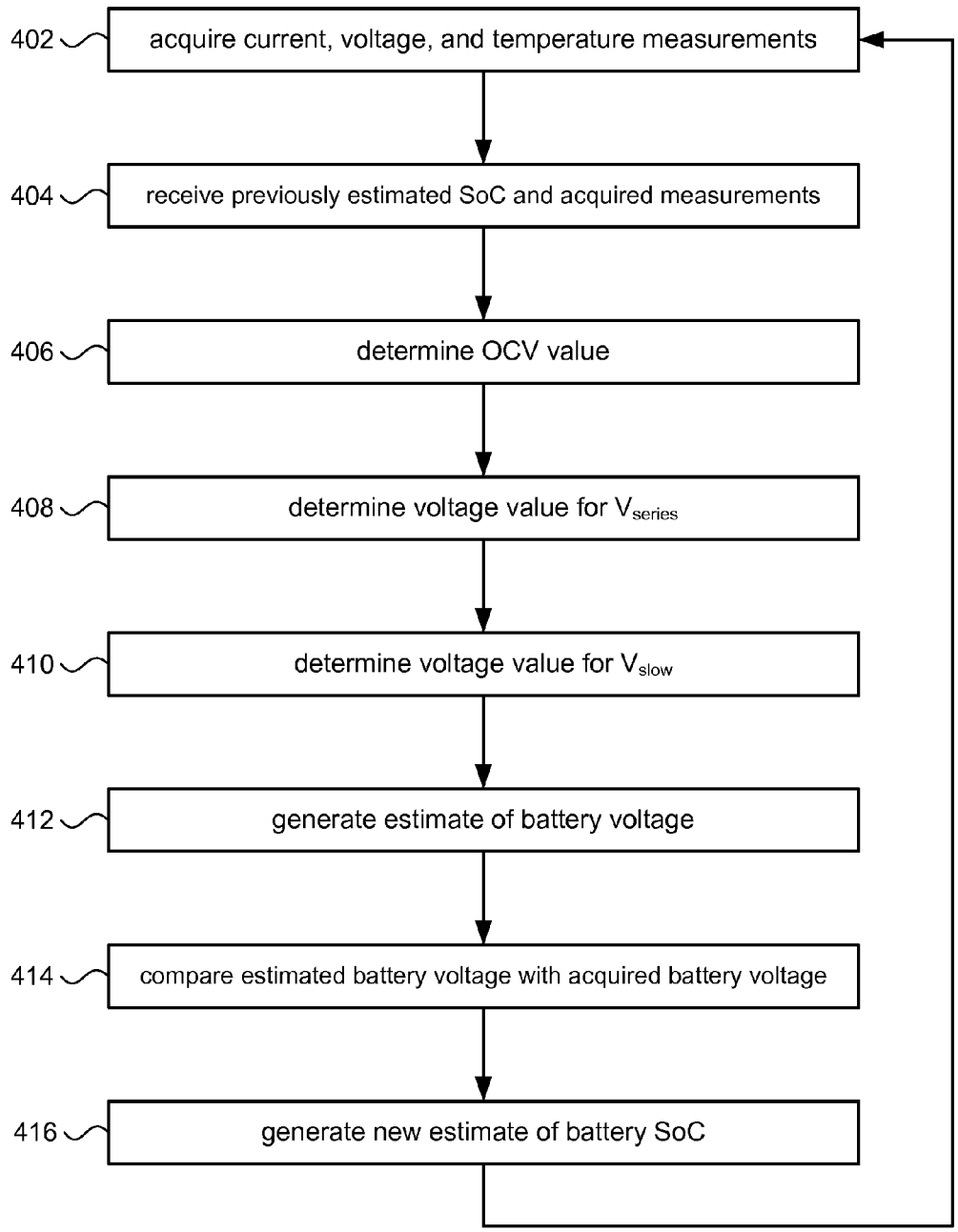
FIG. 4 illustrates a workflow of the system shown in FIG. 1.

FIG. 4 illustrates processing in the fuel gauge system 100 in accordance with the present disclosure. At block 402, the fuel gauge system 100 may acquire various battery measurements. For example, the current sensor 102 may take a measurement of the current flow through the battery 10. The voltage sensor 104 may take a measurement of the battery voltage. The battery's temperature may be taken by the temperature sensor 106.

Processing by the fuel gauge system 100 in accordance with the present disclosure continues in the battery model 112 in order to produce/update the estimate of the battery voltage $V_{BATT(est)}$ based on the most recently estimated battery SoC made in block 404. Accordingly, at block 404, the battery model 112 may receive the battery measurements acquired at block 402 and a previously estimated SoC.

At block 406, the OCV module 302 (FIG. 3) may produce an OCV value based on the estimated battery SoC. Referring back to FIGS. 2A and 2B for a moment, it is understood in the battery arts that OCV is dependent of several factors, including for example, the battery SoC, the temperature, and the state of the battery (e.g., whether the battery is charged or discharged, the battery is being charged in constant current mode or in constant voltage mode, and the like). The first and second RC parallel networks are likewise dependent on battery SoC, temperature, and battery state. The series resistance $R_{series}$ is typically dependent on battery SoC and temperature. A battery model, such as the model illustrated in FIG. 2A which incorporates these factors, may be implemented using a series of tables stored in memory and evaluated by performing series of table lookups. However, the memory requirements can be prohibitively costly, especially in a compact application such as mobile communication devices (e.g., smart phones) and mobile computing devices (e.g., computer tablets) where silicon area is typically limited. Even a simplified battery model, such as illustrated in FIG. 2B, may be impractical to implement if every factor is included in the battery model.

Figure 5A:
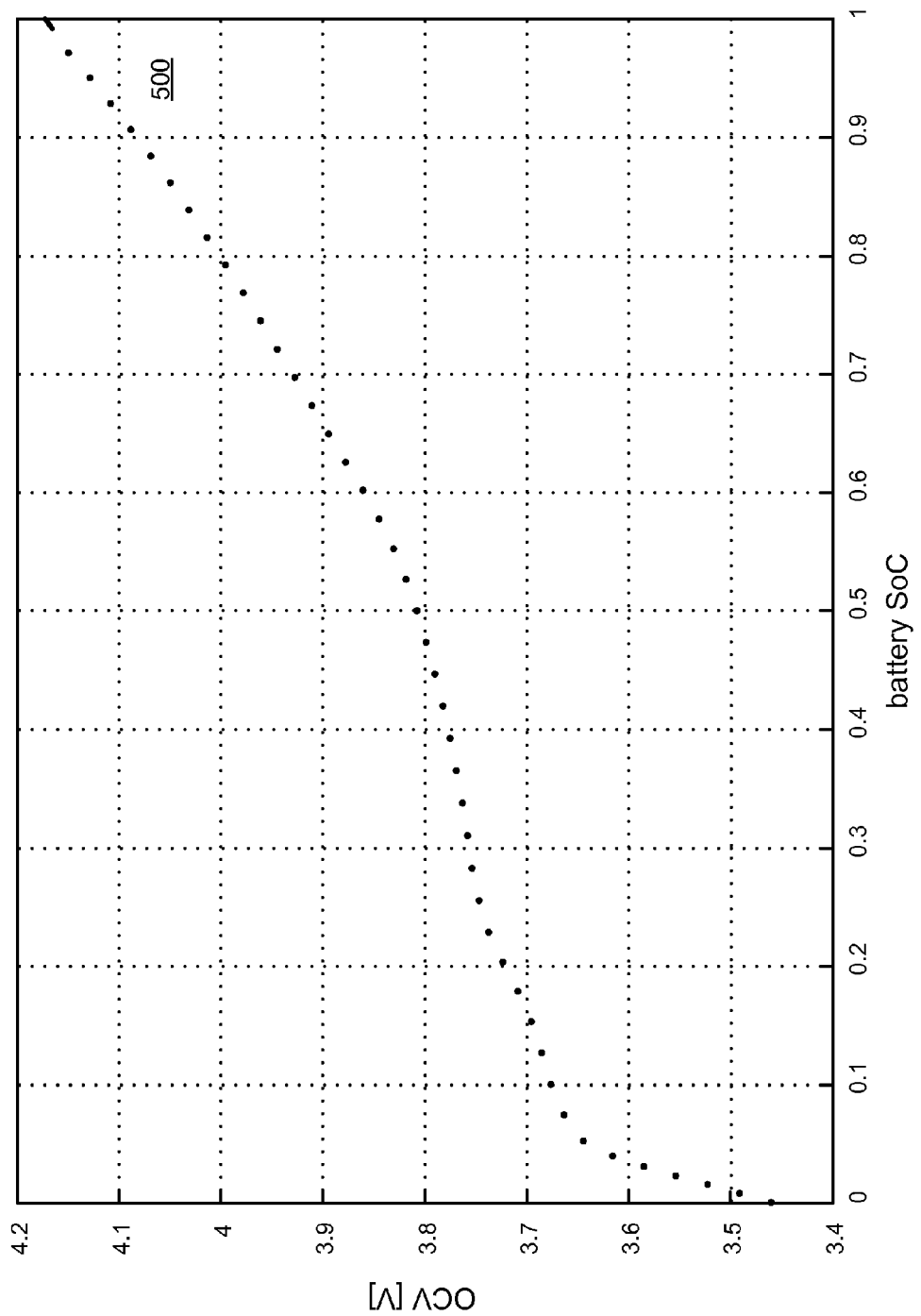
FIGS. 5A and 5B illustrate an example of a relationship between OCV and battery SoC.

Accordingly, in a particular embodiment of the battery model 112, the OCV module 302 may represent OCV values as a function only of the present estimated SoC. An example of such a function will be explained in connection with FIGS. 5A and 5B. FIG. 5A shows the effect of SoC on OCV at a given temperature (e.g., at 30° C.). The data 500 shown in FIG. 5A may be collected using known techniques for characterizing batteries, for example, by charging a battery (or batteries) and discharging it through a load over a period of time at a given temperature, and taking voltage measurements at various charge levels of the battery.

Figure 5B:
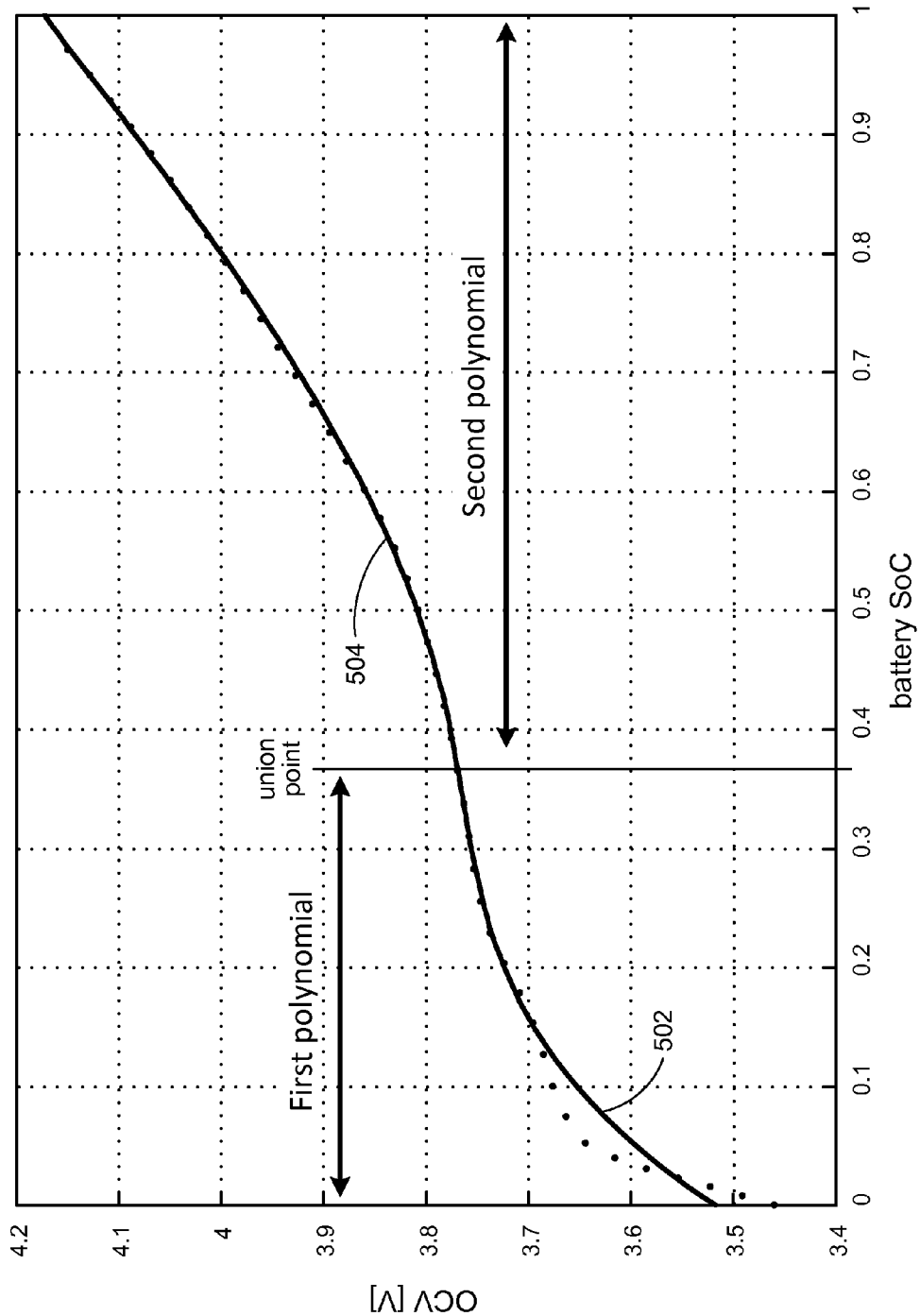

The large amount of data that is collected can be reduced by curve fitting to construct a mathematical function that best fits the data. The amount of data needed to describe the mathematical function is likely to be much smaller in number than the amount of data collected. For example, a $3^{rd}$ degree polynomial ($y=ax^3+bx^2+cx+d$) is characterized by four parameters a, b, c, and d. FIG. 5B illustrates the use of two polynomial curves 502, 504 that have been fitted to different portions of the data 500 shown in FIG. 5A. The union point between the polynomial curves 502, 504 can be chosen to reduce the complexity of the polynomial equations that describe the curves. It will be appreciated that, in other embodiments, a single polynomial curve may be used to fit the data 500. In still other embodiments, the data 500 may be fitted using more than two polynomial curves. It will be further appreciated that higher or lower degree polynomials curves may be used to fit the data, and in general that any suitable curve or curves may be used to fit the data 500.

Returning to FIG. 4, at block 406 the OCV module 302 may generate an OCV value by evaluating one or more mathematical functions that represent the data 500, using the present estimated value of battery SoC as an input to the mathematical function(s).

At block 408, a voltage $V_{series}$ across the series resistance $R_{series}$ may be computed by multiplying the $R_{series}$ value produced by the $R_{series}$ module 304 with the battery current $I_{BATT}$ that is input to the battery model 112. Similarly, at block 410, a voltage $V_{slow}$ across the resistance $R_{slow}$ may be computed by multiplying the $R_{slow}$ value produced by the $R_{slow}$ module 306 with the battery current $I_{BATT}$ that is input to the battery model 112.

At block 412, an estimate of the battery voltage $V_{BATT(est)}$ may be computed by subtracting the $V_{series}$ and $V_{slow}$ values obtained at respective blocks 410 and 412 from the OCV value obtained at block 406.

At block 414, the fuel gauge system 100 may compare the estimate of the battery voltage $V_{BATT(est)}$ with the acquired battery voltage $V_{BATT(meas)}$; e.g., using comparator 122 (FIG. 1). Based on the comparison and a previously estimated battery SoC, the fuel gauge system 100 may generate a new estimate of the battery SoC, at block 416. Processing may loop back to block 402 and repeated to compute the next estimated value of battery SoC in a subsequent iteration using the newly estimated battery SoC as the previously estimated battery SoC.

As explained above, the series resistance $R_{series}$ varies with the present estimated value of battery SoC, temperature, production spread, aging, and the like. Implementing the relationship between the series resistance $R_{series}$ and the present estimated value of battery SoC and temperature can require large amounts of memory, which may not be suitable in some compact electronic devices where silicon area is at a premium. Therefore, in accordance with principles of the present disclosure, the $R_{series}$ module 304 may simply update the $R_{series}$ value when certain criteria relating to SoC and/or temperature have been met as an alternative to modeling and evaluating a model of the series resistance. A workflow for updating the value of $R_{series}$ will now be described.

Figure 6:
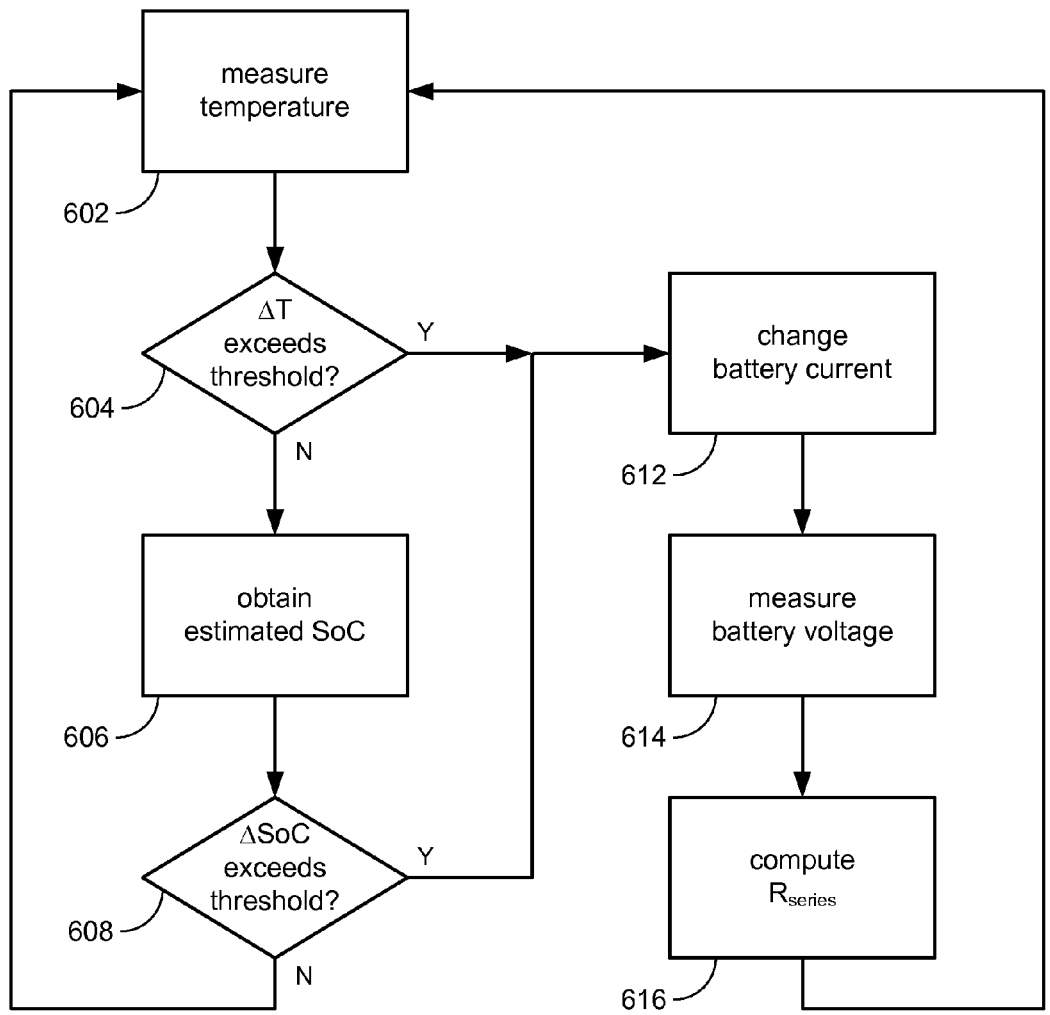
FIG. 6 illustrates a workflow for producing updated $R_{series}$ measurements in accordance with principles of the present disclosure.

Referring to FIG. 6, at block 602 a temperature measurement may be obtained; e.g., from the temperature sensor 106. At block 604, the temperature measurement from block 602 may be compared with the temperature value that was used in a previous $R_{series}$ computation. If a change in the two temperature measurements exceeds a threshold value, then processing may proceed to block 612. If, on the other hand, the change in the two temperature measurements does not exceed a threshold value, then processing may continue with block 606.

At block 606, the present estimated value of the battery SoC may be obtained; e.g., from the output of summing element 124. At block 608, the present estimated value of the battery SoC may be compared with the estimated value of the battery SoC that was used in a previous $R_{series}$ computation. If a change in the two battery SoC values exceeds a threshold value, then processing may proceed to block 612; otherwise, processing may loop back to block 602 and reiterated at the appropriate time.

Re-computing the $R_{series}$ value, in accordance with some embodiments, may begin with block 612. The fuel gauge system 100 may change the current flow through the battery 10 (e.g., via the $R_{series}$ module 304), where the change in current through the battery can be represented by $\Delta I$. In some embodiments, the change in battery current may be effected by changing the battery's sink current or by changing the battery's source current.

At block 614, the battery voltage $V_{BATT(meas)}$ may be acquired (e.g., using voltage sensor 104). Using a previous measurement of the battery voltage $V_{BATT(meas)}$, $\Delta V$ may be determined which represents the corresponding change in the battery voltage resulting from the change in battery current effected in block 612. At block 616, the $R_{series}$ value may be computed from $$\frac{\Delta V}{\Delta I}.$$

Processing may then loop back to block 602 and reiterated at the appropriate time.

In some embodiments, the workflows in FIGS. 4 and 6 may be implemented as program code that can be executed by a data processor, or a digital signal processor (DSP), and so on. For example, each workflow may be implemented as one or more processes executing on a data processor. In other embodiments, the workflows in FIGS. 4 and 6 may be implemented in hardware such as field programmable gate arrays (FPGAs) and the like.

It is noted that the workflow shown in FIG. 4 and the workflow shown in FIG. 6 can be independently and asynchronously performed with respect to each other. For example, the workflow of FIG. 4 may be performed to compute battery SoCs, including evaluating the battery model 112, on a periodic basis or according to any other suitable schedule or criteria. Likewise, the workflow of FIG. 6 may be performed according to the criteria set forth in the workflow.

Figure 7:
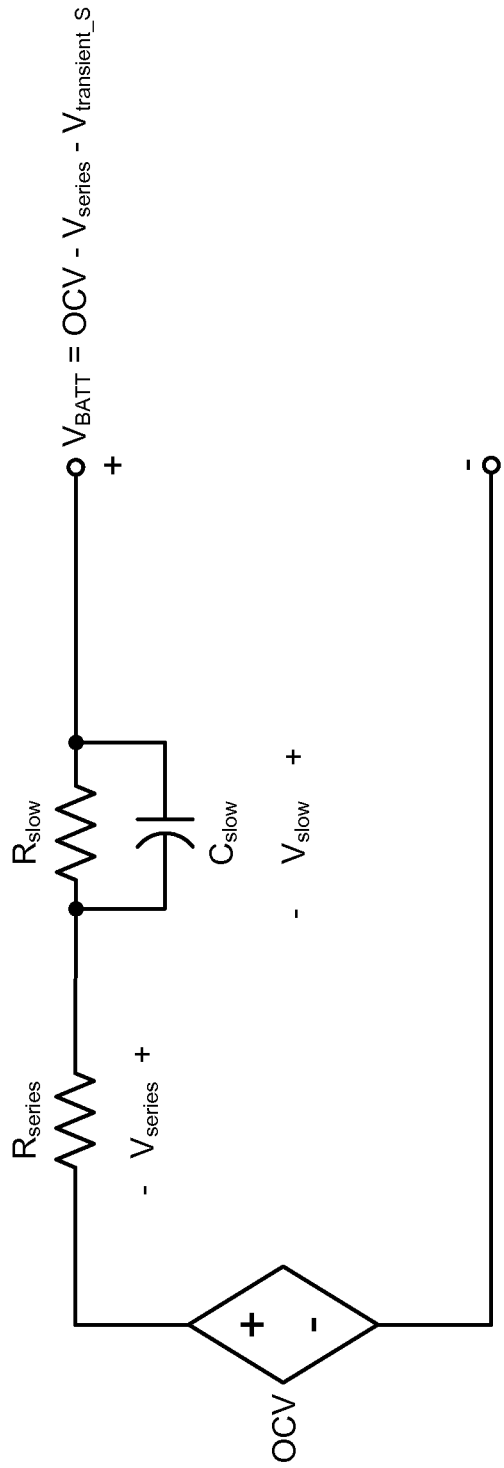
FIG. 7 illustrates another example of a battery model.

In some embodiments, the general battery model shown in FIG. 2A may be simplified as shown in FIG. 7. The electrical battery model shown in FIG. 7 retains the short transient RC parallel network instead of replacing the parallel network with the resistor $R_{slow}$ as in FIG. 2A. In addition, the OCV value and the resistor values for $R_{series}$ and $R_{slow}$, each is modeled as a function of the battery SoC, the battery temperature, and the battery state. The battery state refers to state information about the state of charge of the battery. The battery state indicates if the battery is in a charging state, a discharging state, whether the battery is fully charged (full), or discharged (empty). If the battery is in a charging state, additional state information may indicate that the battery is in a constant-current (CC) charging mode or a constant voltage (CV) charging mode.

Figure 8:
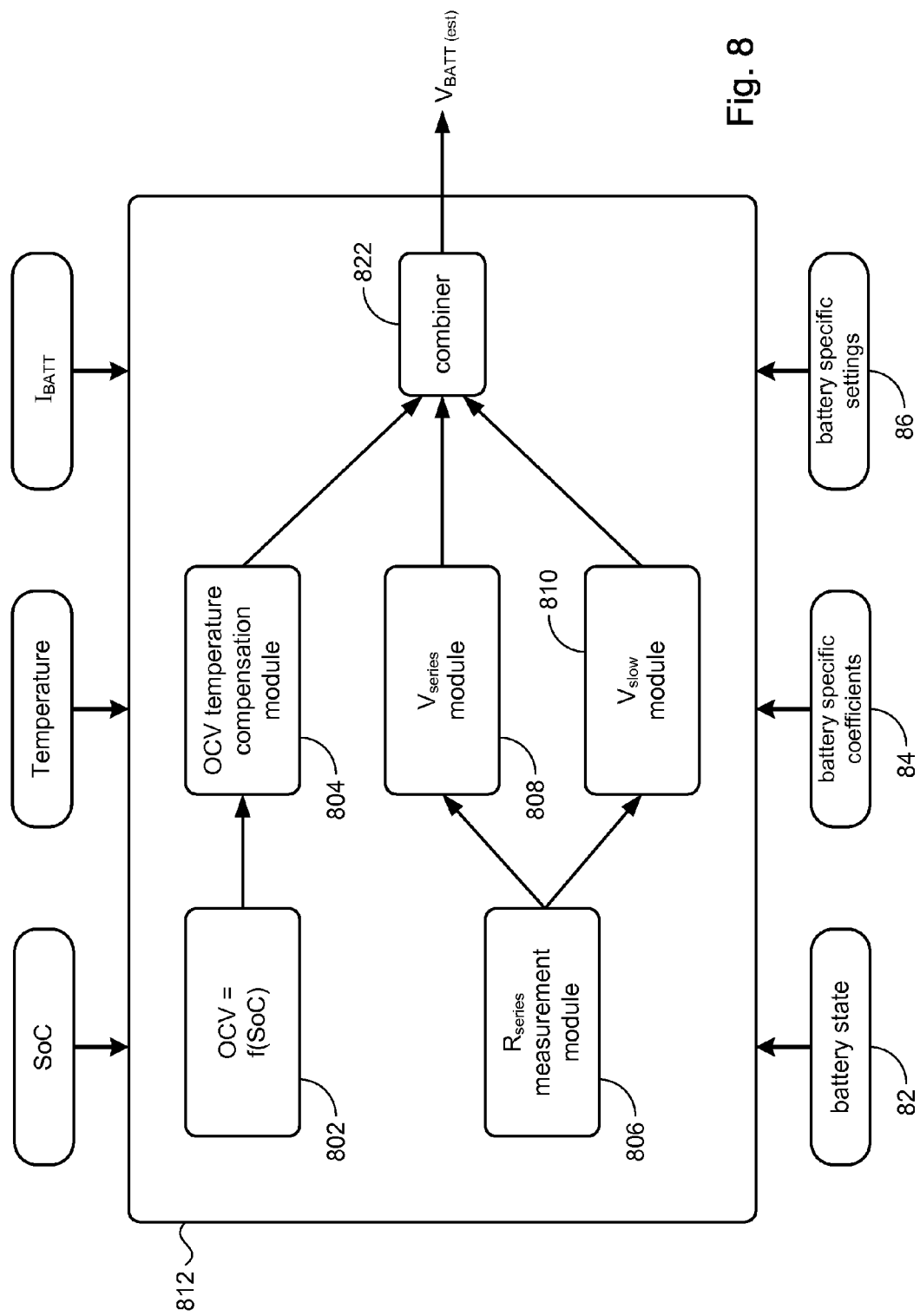
FIG. 8 illustrates another embodiment of a battery model.

FIG. 8 illustrates an embodiment of a battery model 812 in accordance with the electrical battery model shown in FIG. 7, which may be used in the fuel gauge system 100 in place of battery model 112. Inputs to the battery model 812 include the battery SoC, the battery temperature, and the battery current $I_{BATT}$ as explained above in connection with the embodiment of the battery model 112 shown in FIG. 3. In some embodiments, additional inputs to the battery model 812 may include battery state information 82, battery specific coefficients 84 (e.g., parameters of the mathematical functions), and battery specific settings 86 (e.g., valid ranges of temperature, battery voltage, battery current, and so on). The additional inputs may inform how to evaluate the battery model 812, for example, by enabling and/or disabling portions of program code that implement the battery model, altering the flow in the program code, and so on.

The battery model 812 may include an OCV module 802, which produces an OCV value based on battery SoC, and a temperature compensation module 804, which provides temperature compensation for the OCV value produced by the OCV module. An $R_{series}$ measurement module 806 may produce an $R_{series}$ value. A $V_{series}$ module 808 may produce a voltage value $V_{series}$ that represents a voltage drop across the $R_{series}$ resistor (FIG. 7). A $V_{slow}$ module 810 may produce a voltage value $V_{slow}$ that represents a voltage drop across the RC parallel network (FIG. 7). A combiner 822 may combine the outputs of modules 804, 808, and 810 to produce the estimated battery voltage $V_{BATT(est)}$.

Figure 9:
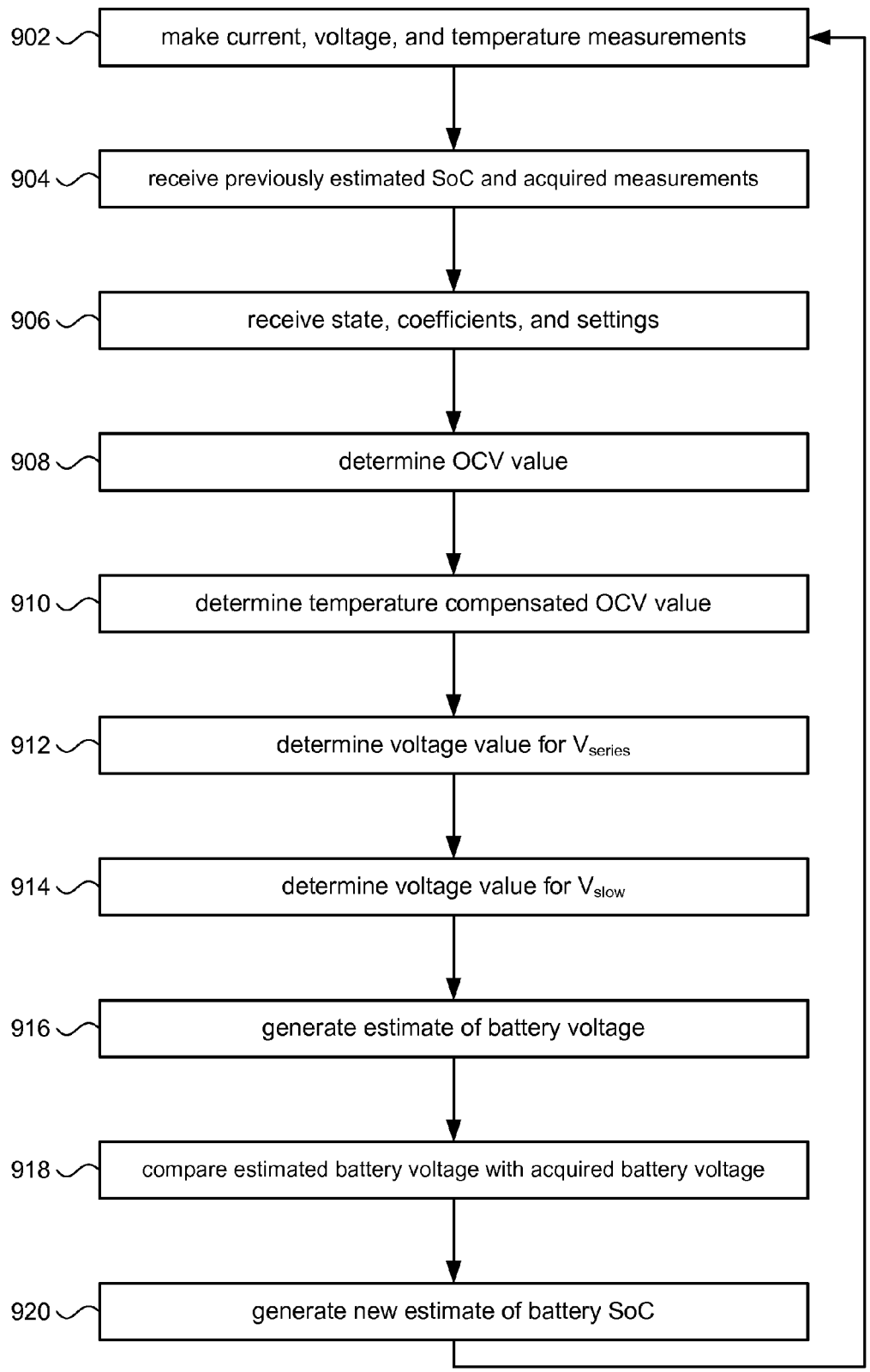
FIG. 9 illustrates a workflow of the system shown in FIG. 1 using the battery model of FIG. 8.

FIG. 9 illustrates processing in the fuel gauge system 100 using the battery model 812 in place of battery model 112. At block 902, the fuel gauge system 100 may acquire various battery measurements. For example, the current sensor 102 may take a measurement of the current flow through the battery 10. The voltage sensor 104 may take a measurement of the battery voltage. The battery's temperature may be taken by the temperature sensor 106.

Processing by the fuel gauge system 100 in accordance with the present disclosure continues in the battery model 812 in order to produce/update the estimate of the battery voltage $V_{BATT(est)}$ based on a previously estimated battery SoC. Accordingly, at block 904, the battery model 812 may receive the battery measurements made at block 902 and the previously estimated battery SoC. At block 906, the battery model 812 may receive additional information used in the battery model, such as battery state 82, battery coefficients 84, and battery settings 86.

At block 908, the OCV module 802 may produce an OCV value based on the estimated battery SoC, for example, by applying the battery SoC to a suitable mathematical function that relates OCV to battery SoC as explained above. Accordingly, the OCV module 802 may generate an OCV value by evaluating one or more mathematical functions that represent the relationship between OCV and battery SoC, using the present estimated value of battery SoC as an input to the mathematical function(s).

At block 910, the temperature compensation module 804 may adjust the OCV value generated at block 908 in order to compensate for temperature. In some embodiments, for example, the adjustment may take the form of a delta value that is combined with the OCV value generated at block 908. The temperature compensation module 804 may include one or more representations of mathematical functions that relate a delta OCV value ($\Delta OCV$) as a function of temperature. Data for the relationship between $\Delta OCV$ and temperature may be collected in a controlled environment by testing one or more batteries under varying temperature conditions. Curve fitting may be used to develop a suitable mathematical function(s) that fits the data. Merely as an example, the mathematical function may be a $3^{rd}$ degree polynomial ($\Delta OCV=ax^3+bx^2+cx+d$), which may be represented by the coefficients a, b, c, and d, where x is battery temperature. For example, in some embodiments, $\Delta OCV$ may be computed using another $3^{rd}$ degree polynomial such as:

$$(a(T-25)^3+b(T-25)^2+c(T-25)+d)$$

where T is temperature in Celsius. In some embodiments, different parameters (a, b, c, d) for the polynomial may be used for different temperature ranges and different battery statuses. Different kinds of functions may be used depending on battery temperature, and so on.

The computed $\Delta OCV$ may be combined (e.g., summed) with the OCV value produced by the OCV module 802 It will be appreciated that any suitable function(s) may be used. In some embodiments, the processing in the temperature compensation module 804 may depend on the battery specific coefficients and the battery specific settings.

At block 912, the $V_{series}$ module 810 may compute a voltage $V_{series}$ across the series resistance $R_{series}$, for example, by multiplying the $R_{series}$ value from the $R_{series}$ measurement module 806 with the battery current $I_{BATT}$ that is input to the battery model 812.

At block 914, the $V_{slow}$ module 812 may compute a voltage $V_{slow}$ across the RC parallel network (FIG. 7) of the battery model 812. In some embodiments, the $R_{slow}$ resistance may be modeled as a function of the $R_{series}$ resistance. Accordingly, the relationship between $R_{slow}$ and $R_{series}$ may be defined by a suitable mathematical function; e.g., based on fitting data collected by characterizing a physical battery(ies). Thus, an $R_{slow}$ value may be determined using a mathematical function(s) that relates $R_{slow}$ with $R_{series}$, using $R_{series}$ as an input to the mathematical function.

In some embodiments, the computed $R_{slow}$ value may be adjusted to compensate for temperature and/or for battery SoC. For example, temperature compensation may be performed using a relationship between $R_{slow}$ and temperature that may be defined by a suitable mathematical function; e.g., based on fitting data collected by characterizing a physical battery(ies). A similar mathematical function may be developed to define a relationship between $R_{slow}$ and SoC to compensate for $R_{slow}$ at different SoCs.

In some embodiments, the $V_{slow}$ module 810 may include low pass filter processing of the battery current $I_{BATT}$ in order to model the effect of $C_{slow}$ in the RC parallel network (FIG. 7) of the battery model 812. For example, the acquired battery current may be low pass filtered before computing $V_{slow}=I_{BATT} \times R_{slow}$. In some embodiments, $V_{slow}$ may be low pass filtered. As in the temperature compensation module 804, processing at block 914 may be dependent on battery status 82, battery specific coefficients 84, and battery specific settings 86.

At block 916, the battery model 812 may compute an estimate of the battery voltage by subtracting the $V_{series}$ and $V_{slow}$ values obtained at respective blocks 912 and 914 from the temperature compensated OCV value obtained at block 910.

At block 918, the fuel gauge system 100 may compare the estimate of the battery voltage $V_{BATT(est)}$ with the acquired battery voltage $V_{BATT(meas)}$; e.g., using comparator 122 (FIG. 1). Based on the comparison and a previously estimated battery SoC, the fuel gauge system 100 may generate a new estimate of the battery SoC, at block 920. Processing may loop back to block 902 to compute the next estimated value of battery SoC in a subsequent iteration using the newly estimated battery SoC as the previously estimated battery SoC.

Figure 10:
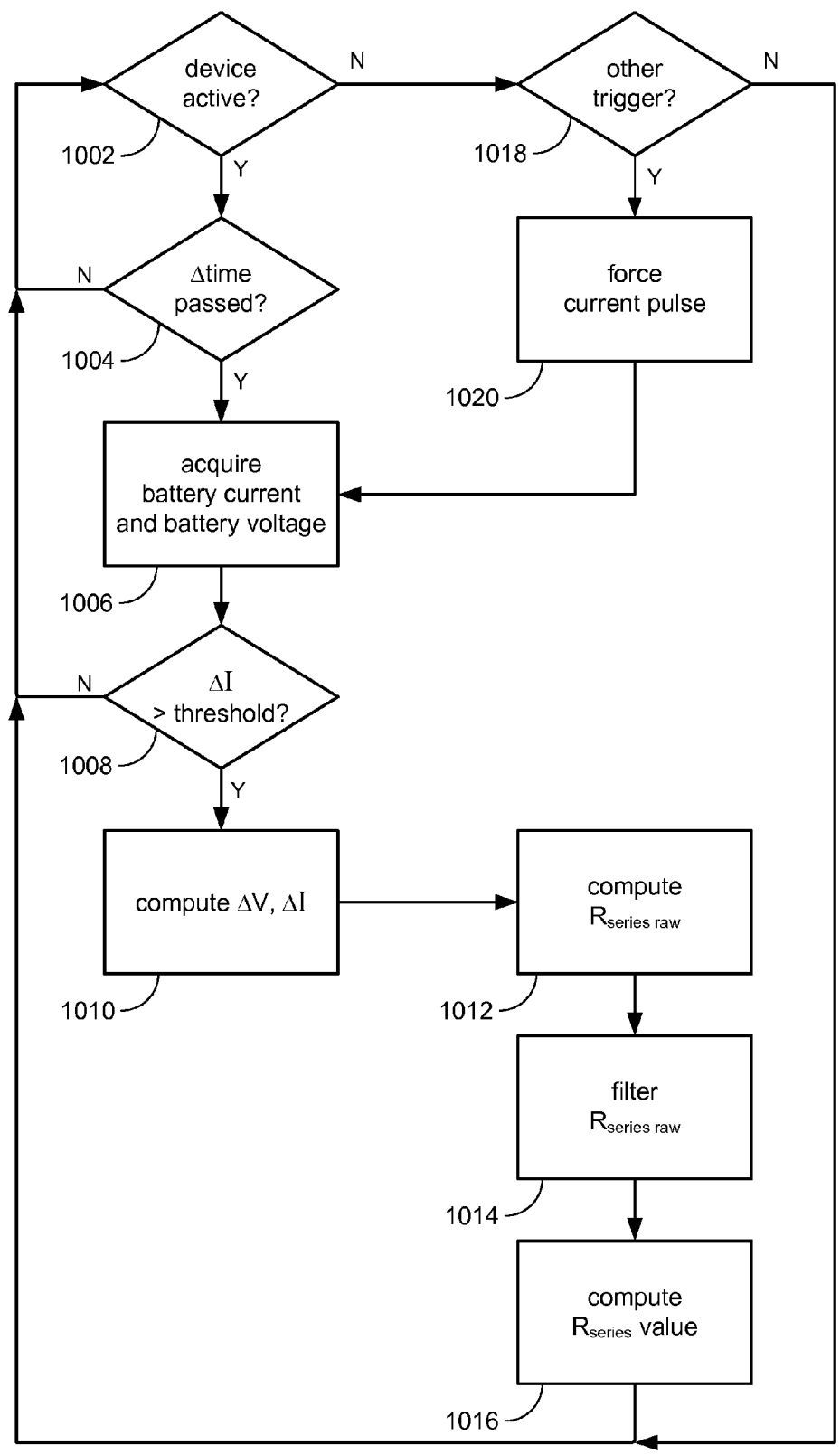
FIG. 10 illustrates a workflow for producing updated $R_{series}$ measurements in accordance with principles of the present disclosure.

Referring now to FIG. 10, a workflow in the $R_{series}$ measurement module 806 will be described. As explained above, the series resistance $R_{series}$ can be related to other parameters of the battery model in a complex way. Accordingly, in some embodiments, the $R_{series}$ measurement module 806 may simply update the $R_{series}$ value in accordance with the workflow shown in FIG. 10 to approximate the series resistance rather than evaluating a complex model of the series resistance.

At block 1002 the fuel gauge system 100 may be informed whether the electronic device (not shown) that is being powered by the battery 10 is active or not. In an embodiment, for example, a system controller (not shown) may produce a signal indicating that the electronic device is deemed to be "active" or "not active" for the purpose of fuel gauge SoC determinations. As another example, fuel gauge system 100 may acquire a battery current measurement and compare the measurement against a threshold value to determine whether the device is active or not active for the purposes of fuel gauge processing. If the device is active (the NO branch of block 1002 is discussed below), then processing continues to block 1004 to determine if a predetermined amount of time $\Delta t$ has passed. In some embodiments, $\Delta t$ may be on the order of seconds (e.g., 2 seconds). It will be appreciated that other values for $\Delta t$ may be used.

After time Δt has elapsed, at block 1006, the $R_{series}$ measurement module 806 may acquire a measurement of the battery current and battery voltage. In some embodiments, both battery current and battery voltage measurements may be acquired concurrently. In some embodiments, this block may be synchronized with the battery current measurements taken for estimating battery SoC. The battery current measurement may be compared to a previous battery current measurement. In some embodiments, for example, the $R_{series}$ measurement module 806 may compute ΔI as an absolute value of the difference between the present battery current measurement and a previous battery current measurement. If at block 1008 ΔI exceeds a predetermined threshold, then processing may proceed to block 1010. Otherwise, processing returns to block 1002 and the process is repeated.

At block 1010, in some embodiments, ΔV may be computed from the following:

$$\Delta V = V_{BATT(previous)} - V_{BATT(present)},$$

and ΔI may be computed from the following:

$$\Delta I = I_{BATT(present)} - I_{BATT(previous)},$$

where $V_{BATT(previous)}$ is a previous measurement of battery voltage,
$I_{BATT(previous)}$ is a previous measurement of battery current,
$V_{BATT(present)}$ is the present measurement of battery voltage, and
$I_{BATT(present)}$ is the present measurement of battery current.
The foregoing assumes a particular sign convention for current flowing out of the battery. In this case, the current flowing out of the battery is defined as positive, and an increase in this current would cause a further drop in the battery voltage. In other embodiments, ΔV may be computed as an absolute value of the difference between the present battery voltage measurement and a previous battery voltage measurement. In such embodiments, the absolute value of ΔI computed at block 1008 may be used for ΔI.

At block 1012 a raw series resistance value $R_{series\ raw}$ may be computed from $$\frac{\Delta V}{\Delta I},$$

using the ΔV and ΔI computations made at block 1010.

At block 1014, the raw series resistance value $R_{series\ raw}$ may be filtered according to the following algorithm to produce a filtered $R_{series\ raw}$ value:
  if $R_{series\ raw}$ is greater than the present $R_{series}$ value by a first predetermined amount, then set $R_{series\ raw}$ to a predetermined maximum value
  if $R_{series\ raw}$ is less than the present $R_{series}$ value by a second predetermined amount, then set $R_{series\ raw}$ to a predetermined minimum value
  otherwise, use the $R_{series\ raw}$ obtained from block 1012

At block 1016, an updated $R_{series}$ value may be computed according to the following:

$$R_{series} = \frac{\text{filtered } R_{series\ raw} + \text{present } R_{series}}{2}.$$

It will be appreciated of course that any other suitable filtering algorithm may be used.

The discussion will now consider the NO branch of block 1002. In some embodiments, the measurement of battery current includes an analog to digital (A/D) operation to digitize the measurement. The measurements are then processed digitally. If the device is not active, then the battery current is likely to be very small. For example, if the electronic device (e.g., smartphone) is in stand-by mode, the current consumption of the battery may be very low. Similarly, if the electronic device is being charged and is in stand-by mode or shut down, then the current consumption profile of the electronic device is likely to be very low. Accordingly, the computed ΔI will be even smaller, and if a small data word (e.g., 8 bits) is used to perform the computations, then at block 1008 it may not be possible to represent and detect ΔI. Accordingly, at block 1002, if the device is determined to be not active, then the $R_{series}$ measurement module 806 may use other criteria to trigger updating the series resistance $R_{series}$.

In some embodiments, a criterion may be a change in temperature (ΔT) that exceeds a predetermined threshold. In other embodiments, a timer may be set to trigger every few seconds or so. Still other criteria may be used. Accordingly, block 1018 may check for the occurrence of one or more criteria that can trigger updating the series resistance $R_{series}$.

When a triggering condition arises, then at block 1020, the $R_{series}$ measurement module 806 may initiate a small load transient to cause a fluctuation in the battery current that can be adequately sampled. In some embodiments, the transient may be synchronized with the battery current measurements taken for estimating battery SoC. It will be appreciated that the load transient may be generated using any suitable circuitry. Processing may then proceed to block 1006, described above to assess whether and how to update the series resistance $R_{series}$.

Figure 11:
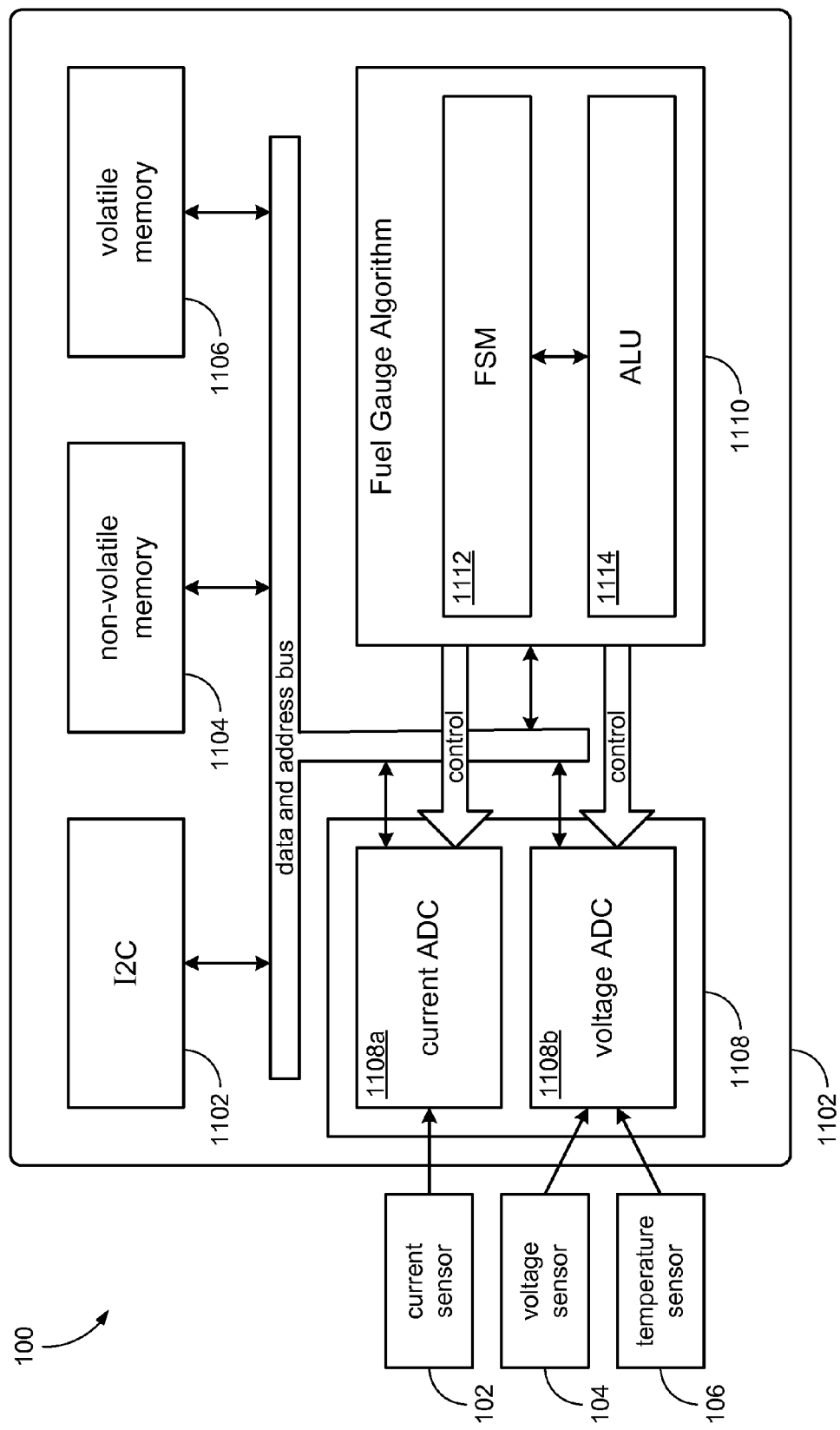
FIG. 11 shows a high level block diagram of an IC device in accordance with the present disclosure.

In some embodiments, the fuel gauge system 100 may be embodied as an integrated circuit (IC) device. FIG. 11 shows a high level block diagram of an IC device 1100 that may include circuitry comprising the fuel gauge system 100. An inter-integrated circuit (I²C) module 1102 may provide communication with the IC device 1100, for example, to configure the device, read and write data, and so on. The IC device 1100 may include memory such as non-volatile memory 1104 and volatile memory 1106.

The non-volatile memory 1104 may be used to store battery specific coefficients 84 (FIG. 8), and battery specific settings 86, and other battery parameters that might be generated from battery characterizations. The non-volatile memory 1104 may store the various mathematical functions described above. In some embodiments, the non-volatile memory 1104 may be a one-time programmable (OTP) memory. In other embodiments, the non-volatile memory 1104 may be re-writable such as flash memory.

The IC device 1100 may include an ADC block 1108 comprising ADC circuitry for converting various analog sense levels to produce suitable digital signals. The ADC block 1108 may include a current ADC 1108a for converting battery current measurements. A voltage ADC 1108b may be provided to convert battery voltage measurements and temperature measurements. In some embodiments, the current ADC 1108a and the voltage ADC 1108b may operate synchronously to provide conversions at the same time, and may be designed to have the same conversion times.

The IC device 1100 may include a processor block 1110. The processor block 1110 may comprise an arithmetic logic unit (ALU) 1114, and may implement a finite state machine (FSM) 1112. The FSM 1112 may keep track of the several battery states that the battery 10 may be placed in. The ALU 1114 may further implement processes to perform the workflows described above; e.g., in FIGS. 4, 6, 9, 10. The FSM 1112 may coordinate the execution of the processes performed by the ALU 1114.

The foregoing elements may be interconnected by a data and address bus, allowing for data to be moved about. The processor 1110 may include control lines to control the ADC block 1108 to take battery current and battery voltage measurements at appropriate times.

The above description illustrates various embodiments of the present invention along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A method for estimating a battery state of charge (SoC) of a battery comprising:
    a processor providing a representation of a battery model, the battery model comprising an open circuit voltage (OCV) component and an equivalent series resistance ($R_{series}$) component;
    the processor acquiring a current measurement of the battery;
    the processor acquiring a voltage measurement of the battery;
    the processor computing a present estimate of the battery SoC using the current measurement, the voltage measurement, and a previous estimate of a battery voltage produced from an evaluation of the battery model;
    the processor evaluating the battery model to compute a present estimate of the battery voltage using at least a value of the OCV component and a voltage of the $R_{series}$ component; and
    the processor updating a value of the $R_{series}$ component when a condition is met, including acquiring at least a measurement of the voltage of the battery and using the measurement to compute an updated value of the $R_{series}$ component.

2. The method of claim 1 wherein the representation of the battery model includes first information that represents the OCV component of the battery model at least as a function of the battery SoC, wherein evaluating the battery model further includes:
    determining a value of the OCV component using the first information and the present estimate of the battery SoC; and
    determining the voltage of the $R_{series}$ component using the value of the $R_{series}$ component and the current measurement.

3. The method of claim 2 wherein the battery model further comprises a transient resistance ($R_{slow}$) component, wherein the representation of the battery model further includes second information that represents a value of the $R_{slow}$ component of the battery model, wherein evaluating the battery model further includes determining a voltage of the $R_{slow}$ component using the value of the $R_{slow}$ component and the current measurement, wherein the present estimate of the battery voltage further uses the voltage of the $R_{slow}$ component.

4. The method of claim 1 wherein updating the value of the $R_{series}$ component further includes changing the current flow through the battery.

5. The method of claim 1 wherein the condition is a measured temperature exceeding a threshold value.

6. The method of claim 1 wherein the condition is an estimate of the battery SoC exceeding a threshold value.

7. The method of claim 1 further comprising repeating the foregoing steps to compute a next estimate of the battery SoC using the present estimate of the battery voltage as the previous estimate of the battery voltage.

8. The method of claim 1 wherein the representation of the battery model comprises one or more polynomial functions.

9. A system to estimate battery SoC of a battery comprising:
    a current sensor to sense current flow in a battery;
    a voltage sensor to sense a voltage of the battery;
    a representation of a battery model, the battery model comprising an open circuit voltage (OCV) component and an equivalent series resistance ($R_{series}$) component, wherein evaluation of the battery model produces an estimated battery voltage; and
    circuitry to compute a present value of battery SoC based on the current flow in the battery, the voltage of the battery, and the estimated battery voltage,
    wherein the estimated battery voltage is based at least on a value of the OCV component and a voltage of the $R_{series}$ component,
    wherein a value of the $R_{series}$ component is updated when a condition is met, including the voltage sensor acquiring a measurement of the voltage of the battery and using the measurement of the voltage of the battery to compute an updated value of the $R_{series}$ component.

10. The system of claim 9 wherein the representation of the battery model includes first information that represents the OCV component of the battery model at least as a function of the battery SoC, wherein an evaluation of the battery model includes:
    determining a value of the OCV component using the first information and the present estimate of the battery SoC; and
    determining the voltage of the $R_{series}$ component using the value of the $R_{series}$ component and the current measurement.

11. The system of claim 10 wherein the battery model further comprises a transient resistance ($R_{slow}$) component, wherein the representation of the battery model further includes second information that represents a value of the $R_{slow}$ component of the battery model, wherein the evaluation of the battery model further includes determining a voltage of the $R_{slow}$ component using the value of the $R_{slow}$ component and the current measurement, wherein the present estimate of the battery voltage further uses the voltage of the $R_{slow}$ component.

12. The system of claim 9 wherein updating the value of the $R_{series}$ component further includes changing the current flow through the battery.

13. The system of claim 9 further comprising a temperature sensor, wherein the condition is a measured temperature made by the temperature sensor exceeding a threshold value.

14. The system of claim 9 wherein the condition is an estimate of the battery SoC exceeding a threshold value.

15. The system of claim 9 wherein the representation of the battery model comprises one or more polynomial functions.

16. A circuit to estimate battery SoC of a battery comprising:
    battery measurement means for acquiring a measure of current flow in a battery and a measure of a voltage of the battery;

a battery voltage estimation means for computing an estimated battery voltage of the battery based on a model of the battery, the model of the battery including an open circuit voltage (OCV) component and an equivalent series resistance ($R_{series}$) component;

a SoC estimation means for computing an estimate of battery SoC using the measure of current flow, the measure of voltage, and a previous estimate of a battery voltage produced by the battery model; and updating means for updating a value of the $R_{series}$ component when a condition is met, including using a measure of the voltage of the battery and a measure of current flow in the battery to compute an updated value of the $R_{series}$ component.

17. The circuit of claim 16 wherein the model of the battery includes first information that represents the OCV component at least as a function of the battery SoC, wherein computing the estimated battery voltage further includes:

determining a value of the OCV component using the first information and the estimate of the battery SoC; and determining a voltage of the $R_{series}$ component using the value of the $R_{series}$ component and the measure of current flow.

18. The circuit of claim 17 wherein the model of the battery further comprises a transient resistance ($R_{slow}$) component and second information that represents a value of the $R_{slow}$ component, wherein computing the estimated battery voltage further includes determining a voltage of the $R_{slow}$ component using the value of the $R_{slow}$ component and the measure of current flow.

19. The circuit of claim 16 wherein updating the value of the $R_{series}$ component further includes changing the current flow through the battery.

20. The circuit of claim 16 further comprising a temperature sensor, wherein the condition is a measured temperature made by the temperature sensor exceeding a threshold value.

* * * * *